United States Patent
Tsironis

(10) Patent No.: US 8,933,707 B1
(45) Date of Patent: Jan. 13, 2015

(54) WAVEGUIDE IMPEDANCE TUNERS WITH PLANARITY ADJUSTMENT FOR WAFER PROBING

(76) Inventor: Christos Tsironis, Kirkland (CA)

( * ) Notice: Subject to any disclaimer, the term of this patent is extended or adjusted under 35 U.S.C. 154(b) by 603 days.

(21) Appl. No.: 13/153,779

(22) Filed: Jun. 6, 2011

(51) Int. Cl.
*G01R 27/04* (2006.01)

(52) U.S. Cl.
USPC .................. 324/637; 324/207.13; 324/750.22

(58) Field of Classification Search
CPC ........... G01D 5/145; G01B 7/30; G01B 7/003
USPC ................................ 324/207.13, 637, 750.22
See application file for complete search history.

(56) References Cited

U.S. PATENT DOCUMENTS

| | | | | |
|---|---|---|---|---|
| 2,696,834 A * | 12/1954 | Carr | ................................ | 285/55 |
| 6,538,454 B1 * | 3/2003 | Frenkel et al. | ................ | 324/637 |
| 6,850,076 B2 * | 2/2005 | Tsironis | ........................ | 324/637 |
| 7,595,709 B1 * | 9/2009 | Boulerne | ...................... | 333/263 |
| 2003/0107363 A1 * | 6/2003 | Tsironis | .......................... | 324/95 |
| 2010/0026315 A1 * | 2/2010 | Simpson | ...................... | 324/600 |

OTHER PUBLICATIONS

Coplanar waveguide—Microwave Encyclopedia, http://www.microwaves101.com/encyclopedia/coplanarwaveguide.cfm.
Microwave Engineering Corp., Flexible Waveguide, http://www.microwaveeng.com/wg_flex.htm.
Millitech, LLC, Circular waveguide sizes, http://www.millitech.com/pdfs/circwave.pdf.
iCCMT-75500, Waveguide Tuner Datasheet, Focus Microwaves.

\* cited by examiner

*Primary Examiner* — Tung X Nguyen
*Assistant Examiner* — Alesa Allgood

(57) ABSTRACT

An assembly of electro-mechanical impedance tuner covering frequencies in the millimeterwave region (26-110 GHz) uses wafer probes to test chips on wafer with capacity of adjusting the probe tip planarity. The assembly uses flexible waveguide between the tuner test port and the wafer probe port and micrometer adjustment of the planarity angle Θ between the plan of the probe tips and the wafer surface in order to optimize RF and DC contact.

6 Claims, 15 Drawing Sheets

Assembly using a bent section of flexible waveguide between tuner test port and wafer probe

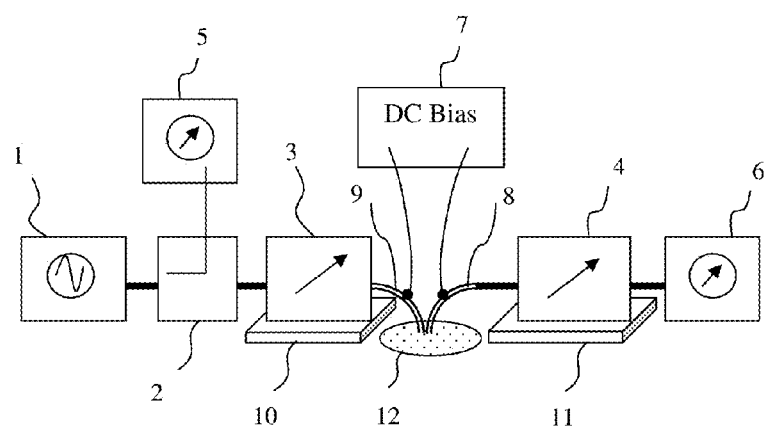
FIGURE 1: Prior art, waveguide Load Pull system for biasing and testing transistor chips on wafer

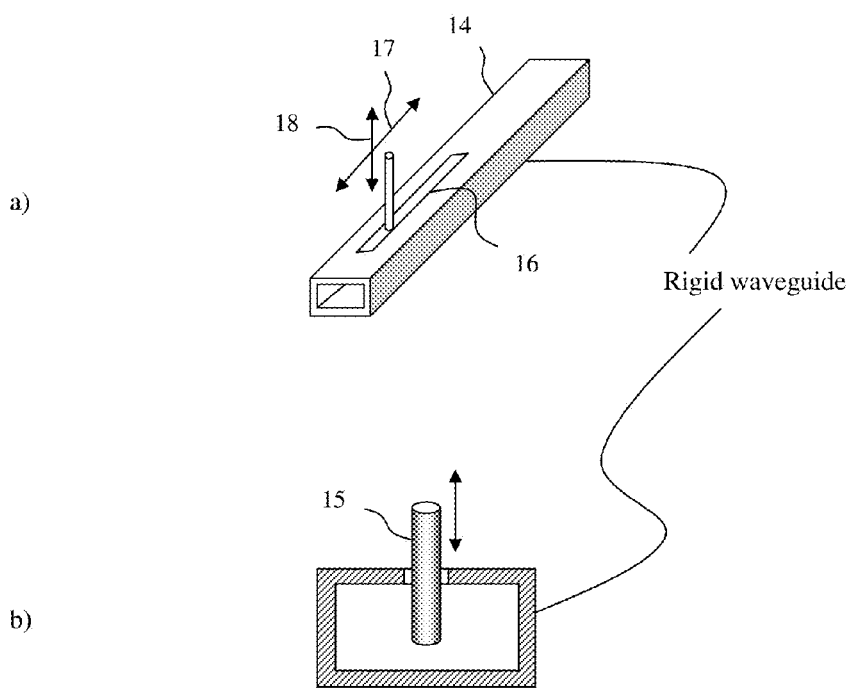
FIGURE 2: Prior art, basic configuration of waveguide slide screw impedance tuner principle

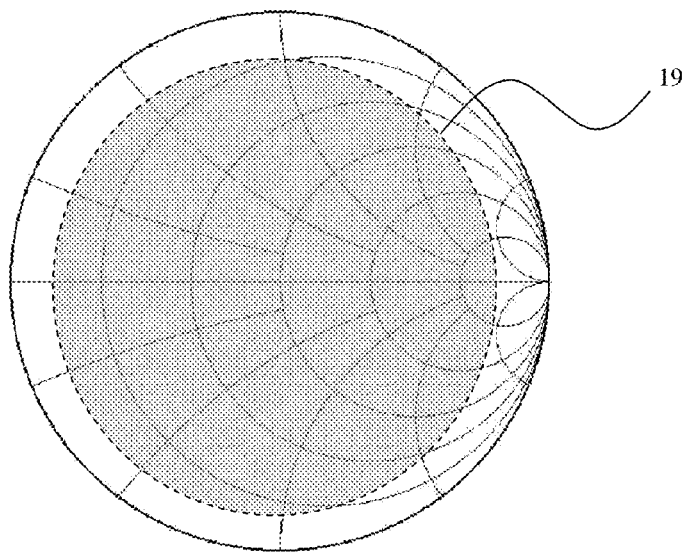
FIGURE 3: Prior art, tuning range of slide screw impedance tuner

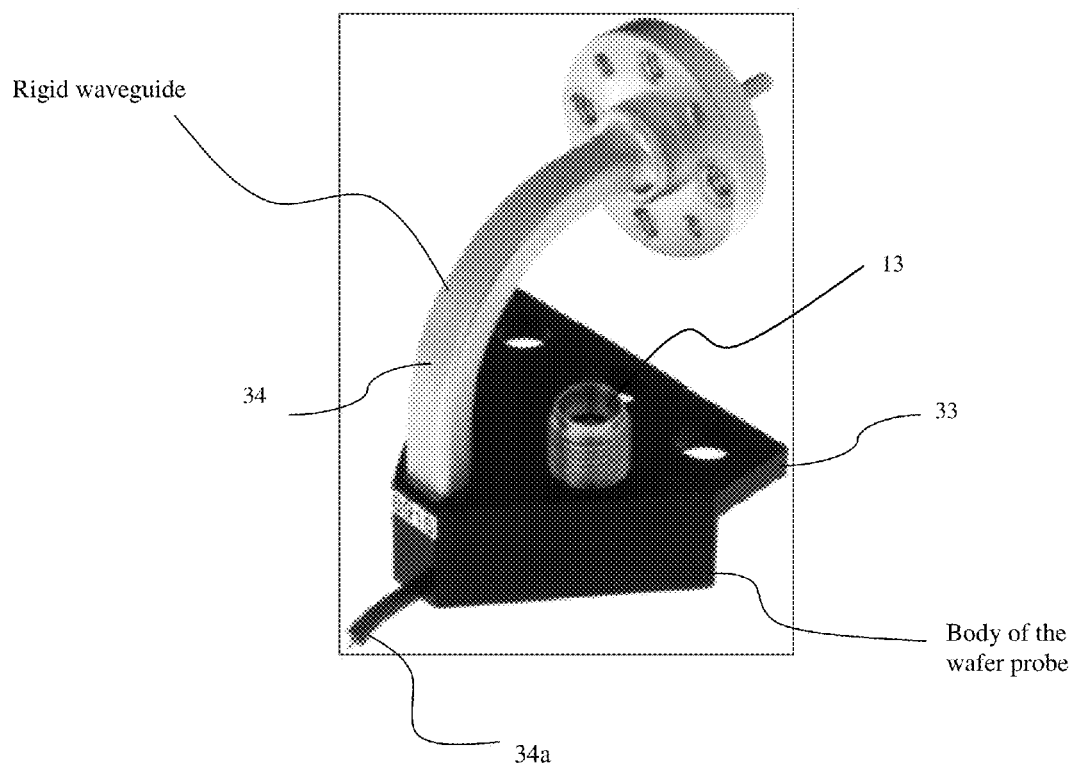
FIGURE 4: Prior art, commercially available waveguide wafer probe with DC biasing capacity

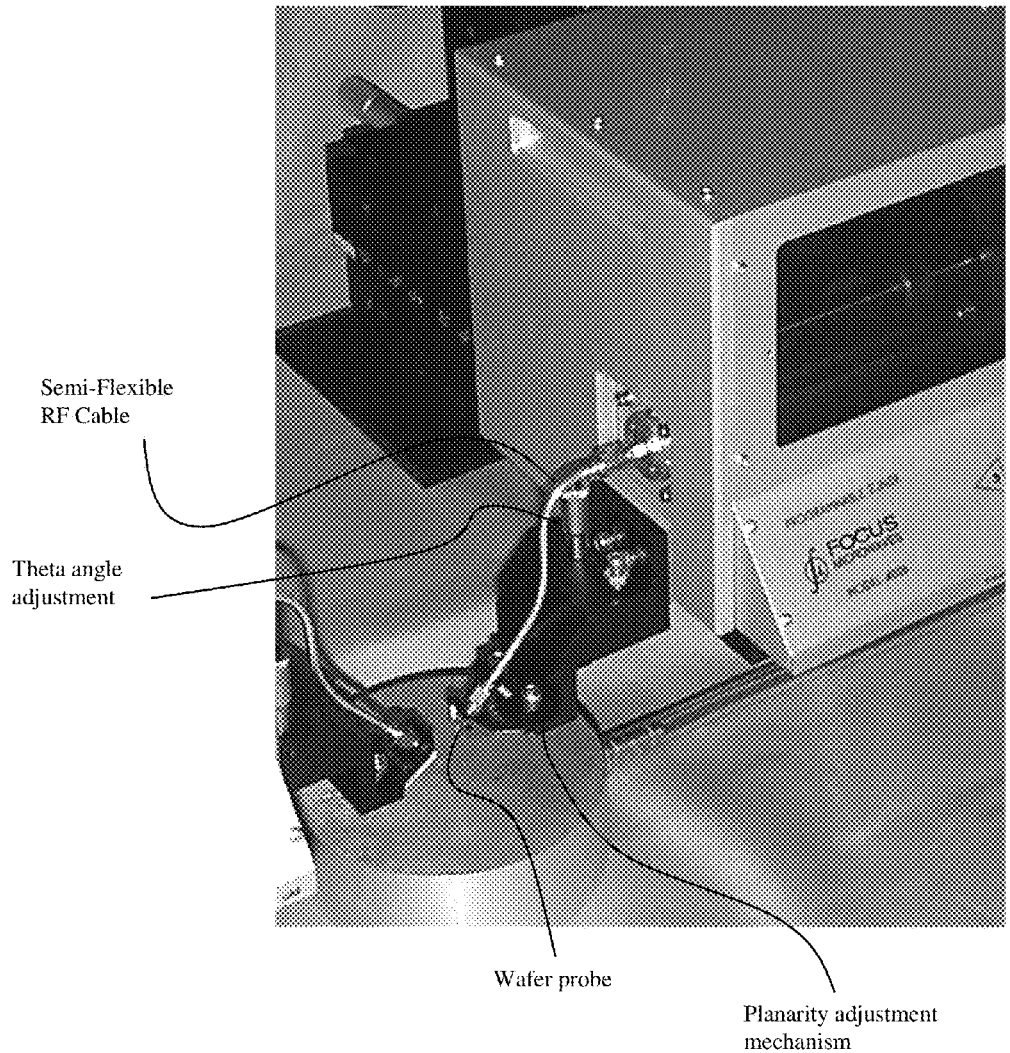
FIGURE 5: Prior art, wafer probe tuner assembly, using semi-flexible coaxial RF cable, with Theta angle adjustment

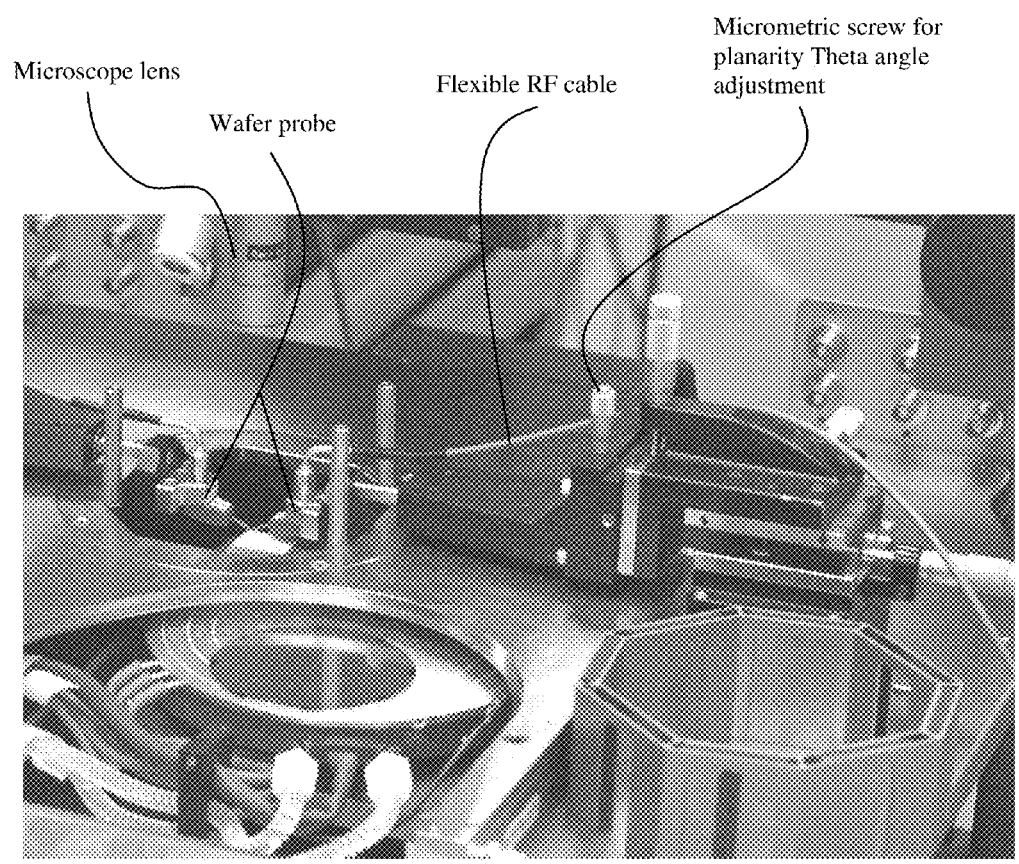
FIGURE 6: Prior art, RF wafer probing of chip transistors using flexible cables (no impedance tuner) with Theta angle adjustment

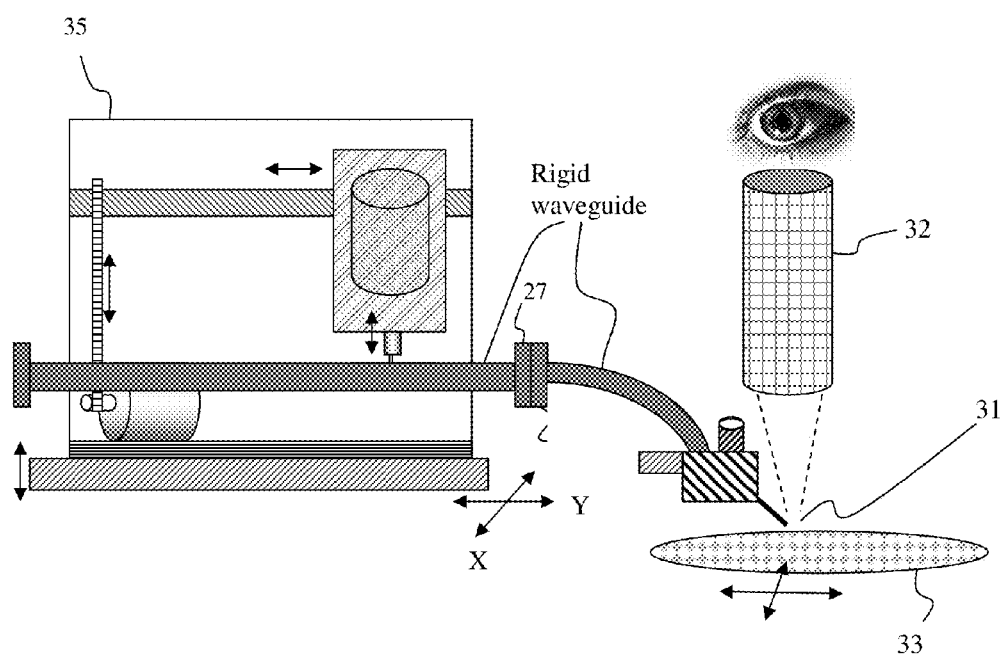
FIGUR 7: Prior art, waveguide impedance tuner and wafer probe assembly

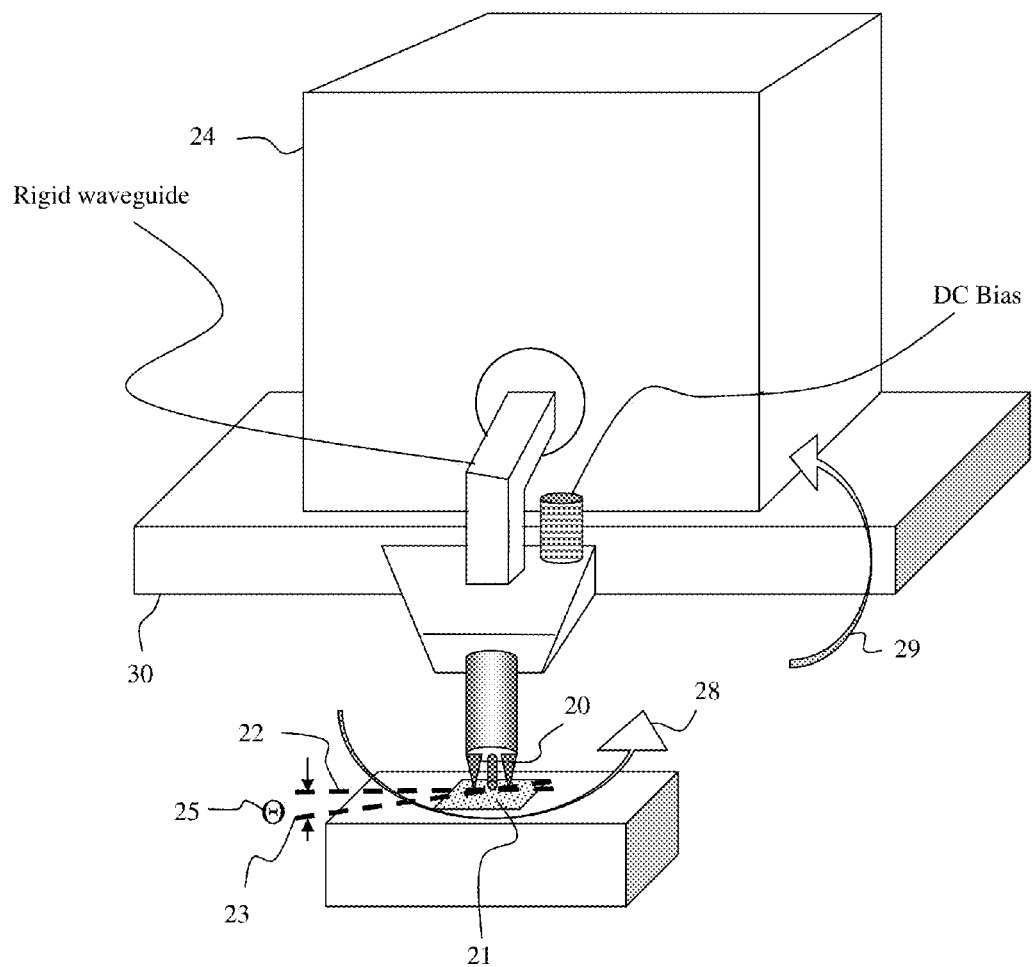
FIGURE 8: Prior art, Theta angle adjustment through waveguide tuner rotation causing probe movement on an arc

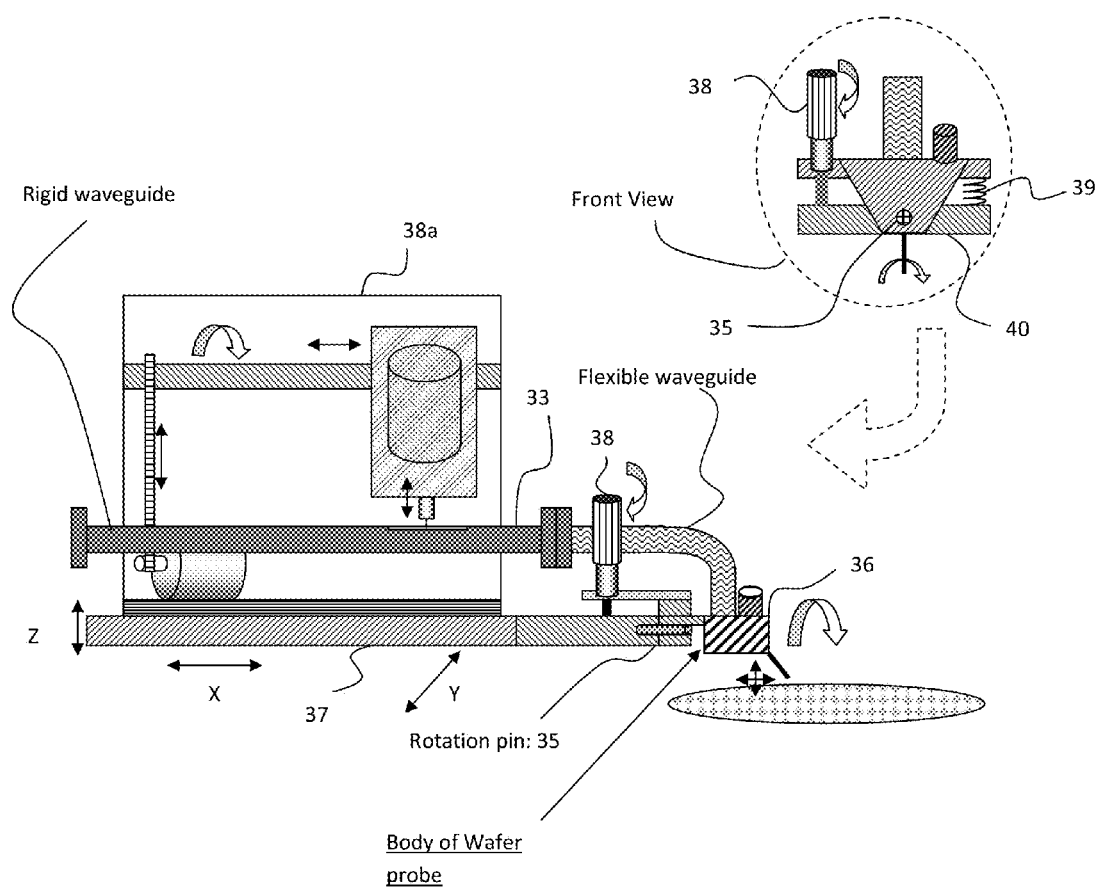
Figure 9: Waveguide impedance tuner and wafer probe assembly using flexible waveguide for local Theta angle arrangement

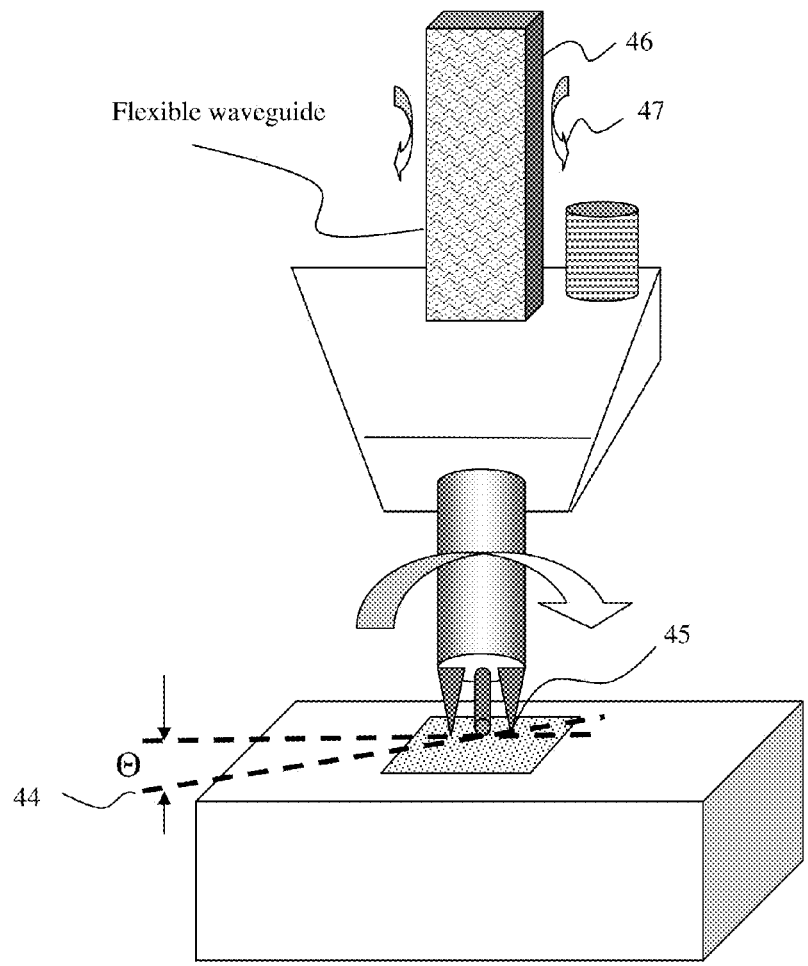
FIGURE 10: Detail view of waveguide probe assembly using flexible waveguide for Theta angle adjustment a)
b)
Flexible waveguide
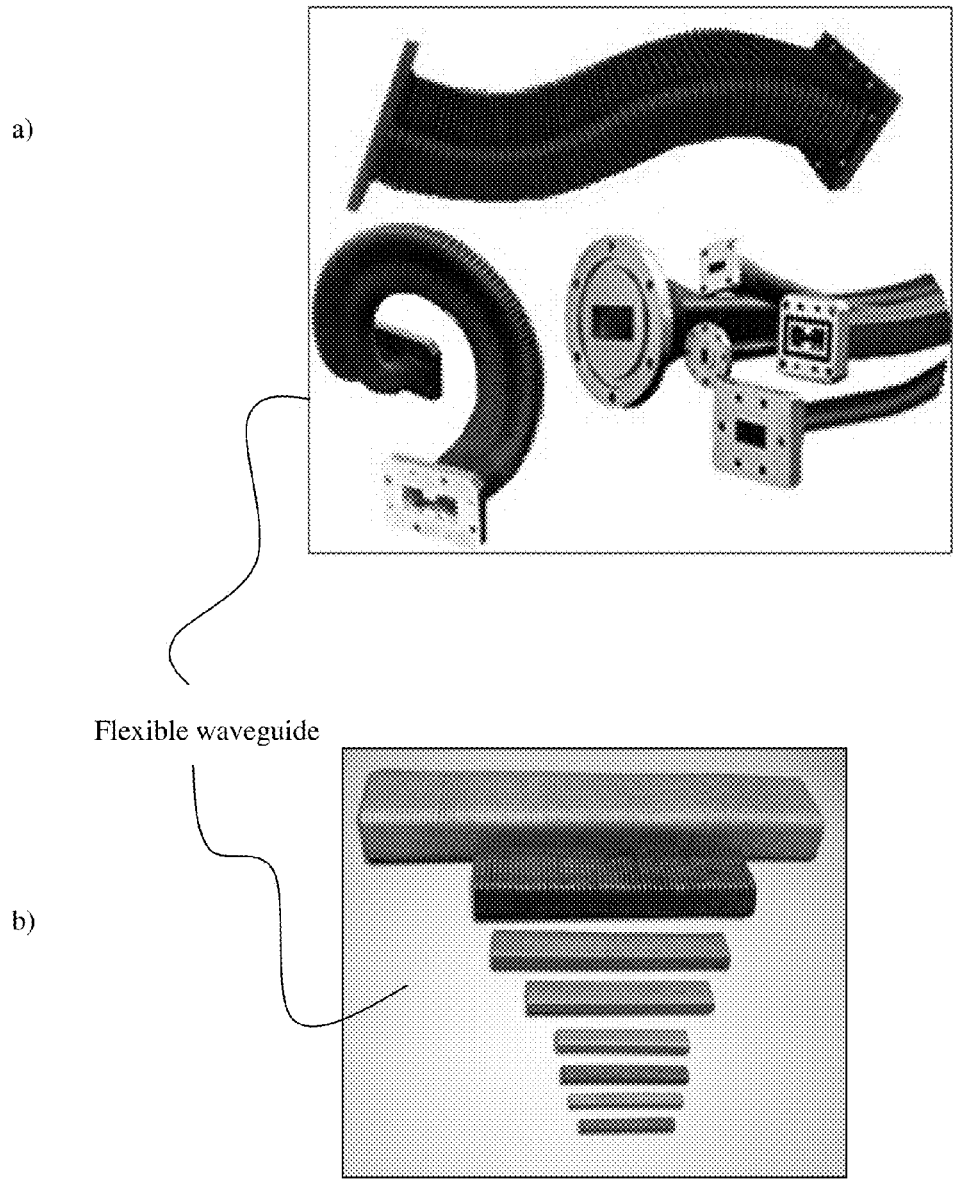
FIGURE 11: Commercially available flexible waveguide sections b) and assemblies a)

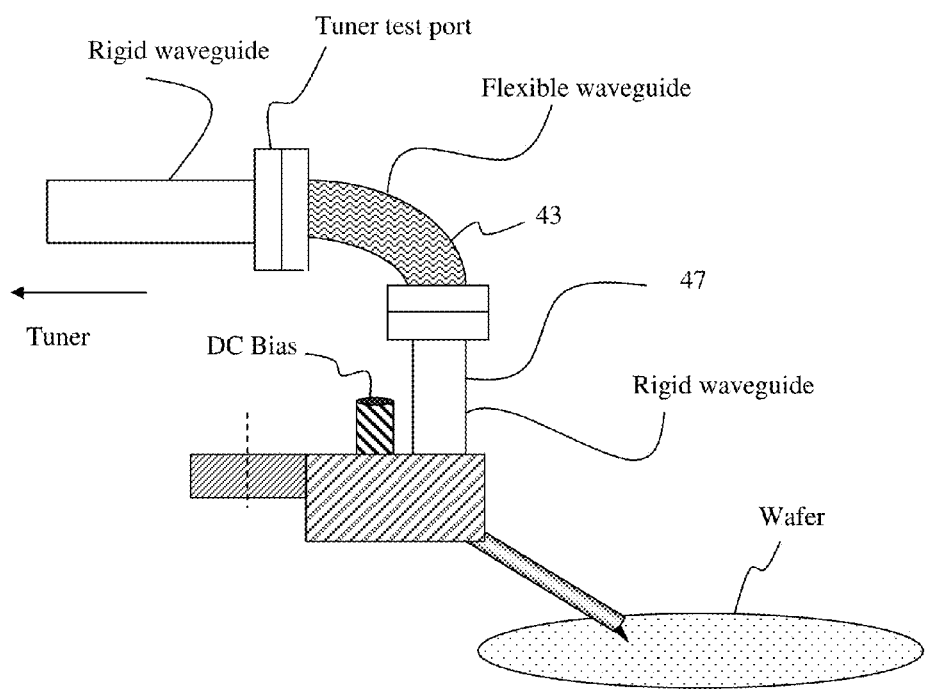
FIGURE 12: Assembly using a bent section of flexible waveguide between tuner test port and wafer probe

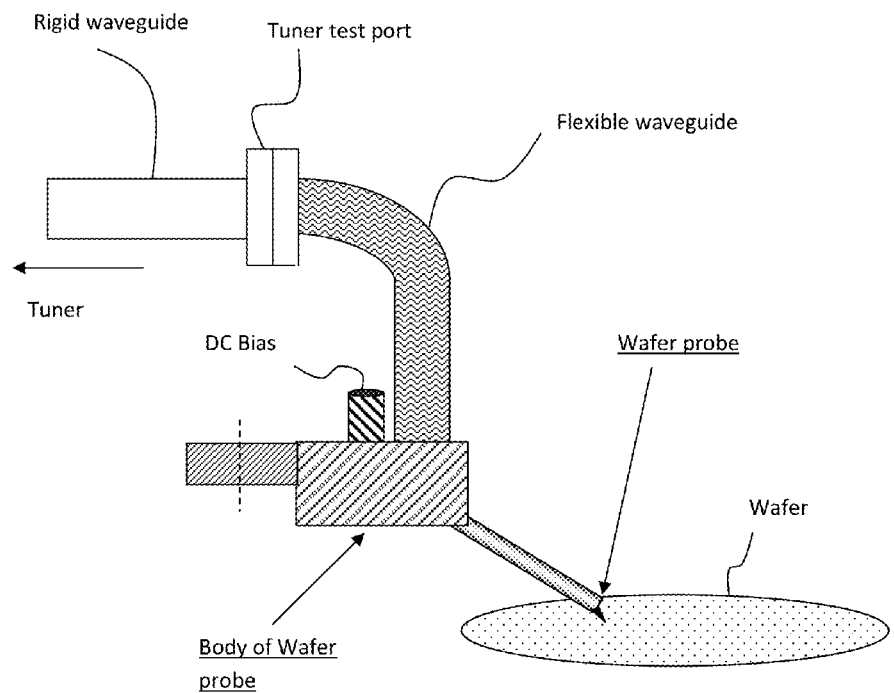
Figure 13: Assembly using a flexible waveguide section between probe body and tuner test port

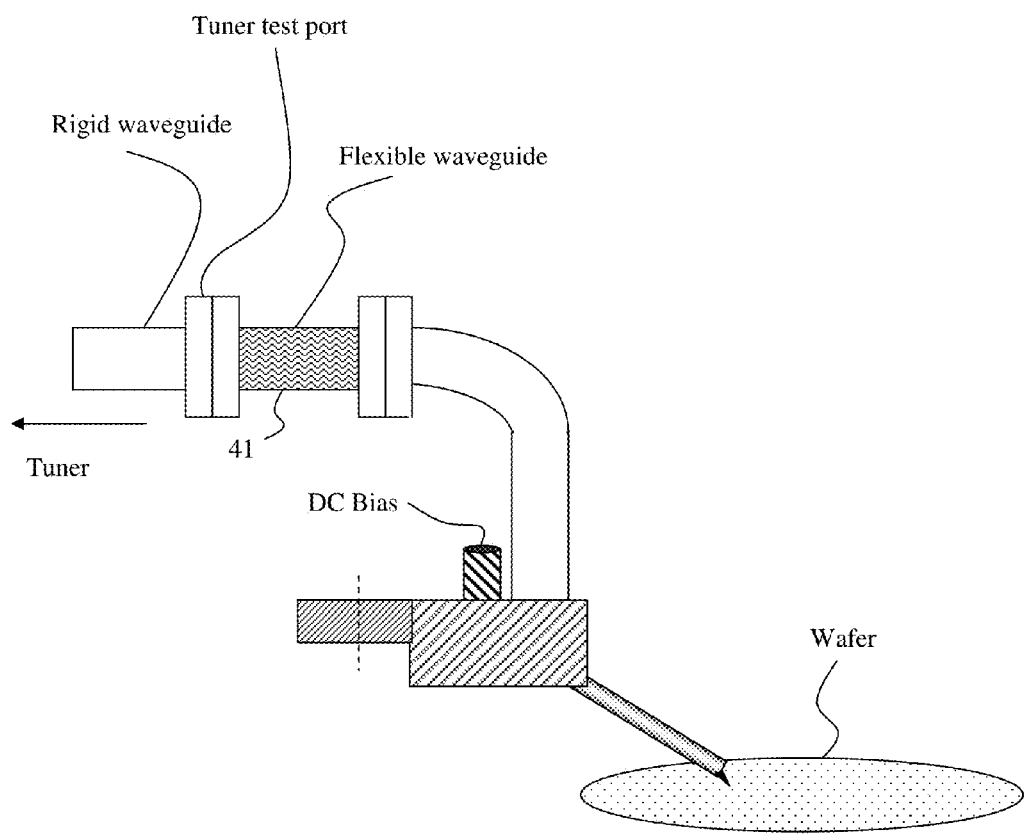
FIGURE 14: Assembly using a straight section of flexible waveguide between the probe and the tuner test port

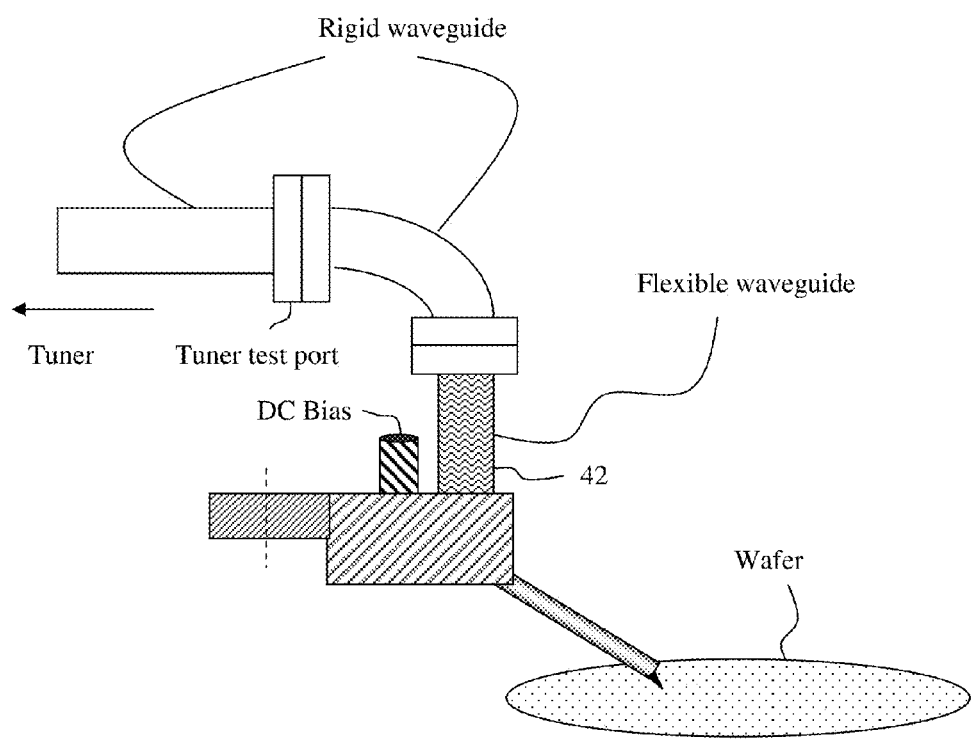
FIGURE 15: Assembly using a straight section of flexible waveguide between the extended tuner test port and the probe body

US 8,933,707 B1

WAVEGUIDE IMPEDANCE TUNERS WITH PLANARITY ADJUSTMENT FOR WAFER PROBING

PRIORITY CLAIM

Not Applicable

CROSS-REFERENCE TO RELATED ARTICLES

[1] Coplanar Waveguide—Microwave Encyclopedia, http://www.microwaves101.com/encyclopedia/coplanarwaveguide.cfm
[2] Microwave Engineering Corp, Flexible waveguide, http://www.microwaveeng.com/wg flex.htm
[3] Millitech, LLC, Circular waveguide sizes, http://www-.millitech.com/pdfs/circwave.pdf
[4] iCCMT-75500, Waveguide Tuner Datasheet, Focus Microwaves.

STATEMENT REGARDING FEDERALLY SPONSORED RESEARCH OR DEVELOPMENT

Not Applicable

REFERENCE TO SEQUENCE LISTING, A TABLE, OR A COMPUTER PROGRAM LISTING COMPACT DISC APPENDIX

Not Applicable

BACKGROUND OF THE INVENTION

This invention relates to load pull testing of millimeter power transistors using automatic microwave tuners in order to synthesize reflection factors (or impedances) at the input and output of said transistors.

A popular method for testing and characterizing microwave components (transistors) for high power operation is "load pull" and "source pull". Load pull or source pull are measurement techniques employing microwave tuners and other microwave test equipment. The microwave tuners in particular are used in order to manipulate the microwave impedance conditions under which the Device Under Test (DUT, or transistor) is tested (FIG. 1). A load pull setup comprises, among other parts, a signal source (1), a directional coupler (2), one or two impedance tuners (3, 4), two power meters (5, 6) and a DC power supply (7). It also comprises a test fixture to mount the DUT; at millimeter wave frequencies (typically above 26 GHz) waveguide impedance tuners [4] and components are used due to their lower loss, easier manufacturing and more steady performance. At these frequencies for testing chips on wafer (12) said test fixture is replaced by a pair of waveguide-wafer probes (8, 9 and FIG. 4). Said probes also include DC biasing networks (13), because the waveguide sections themselves do not allow the flow of DC current. The tuners themselves (3, 4) must be mounted on micro-positioners (10, 11) which allow exact positioning of the wafer probes (8, 9), which are rigidly connected to the tuner bodies, in order to make safe and repeatable contact with the chips on the semiconductor wafer (12).

A popular family of electro-mechanical tuners, the "slide-screw tuners", use adjustable probes (slugs) inserted into the transmission media of the tuners. Said transmission media in millimeter-wave frequencies (typically, but not exclusively, frequencies >26 GHz) is a slotted straight section of waveguide (14) in which a metallic probe (pin) (15) is inserted and creates a capacitive load. (FIGS. 2a, b). When the probe (15) is inserted further (18) into the slot (16) of the waveguide the capacitive coupling increases and so does the reflection factor. When the pin is moved along the slot and parallel to the axis of the waveguide (17) the phase of the reflection factor changes. This way a major area (19) of the Smith chart can be covered (FIG. 3). The shadowed area (19) is called the "tuning range" of the tuner.

For testing semiconductor chips on wafer, "wafer probes" must be used, which are able to transfer RF energy to the chips in a reliable and repeatable fashion (FIG. 4). Since the chips are made using planar technology (all RF contacts are on the same side of the semiconductor wafer) the predominant transmission line configuration is Coplanar Waveguide (CPW) [1]; the probe tips are therefore designed using the same technology (CPW). A schematic view of said probe tips is shown in FIGS. 8 and 10. The dimensions are very small. The typical distance between the probe tips (20) is of the order to 100 microns. The probe tips have some elasticity. When pressed against the semiconductor surface (21) they will bend slightly and compensate for a certain angle Θ (Theta) between the plane (22) defined by the three probe tips and the plane (23) of the semiconductor surface (29). However, in many cases this elasticity is not sufficient to compensate for a probe planarity misalignment Θ. This effect is called the Theta angle misalignment (25). There exist techniques allowing the probes to be rotated to correct for the misalignment, but those are applicable only if the probes are connected to a flexible coaxial cable and used to test various RF data, (FIGS. 5, 6). Correcting for the Theta misalignment is particularly difficult when the probes are mounted rigidly on bulky impedance tuners (24), which cannot be tilted (FIG. 8). Using flexible cables to connect impedance tuners with wafer probes allows correcting the Theta angle by rotating only the wafer probes, but the insertion loss of the cables reduces the tuning range (19) of the tuners at the DUT reference plane and needs to be avoided (FIG. 3).

When using waveguide millimeter-wave tuners on-wafer, waveguide wafer-probes must be connected to the tuners (FIG. 8). The wafer probes themselves are use coaxial pieces of cable of very small diameter (34a) which are connected to rigid 90 degree waveguide bends (FIG. 4). FIG. 7 shows the assembly of such a wafer probe with a tuner: The flange at the end of the rigid waveguide bend (26, 34) is attached to the waveguide flange (27) at the test port of the tuner (35). This creates a very low loss rigid connection between tuner and wafer probe. The three end tips (20) of the wafer probes at the end of the coaxial cable (34a), in a typical GSG (Ground-Signal-Ground) coplanar electromagnetic wave configuration (FIG. 8) are made to lie on the same horizontal plane (22), in order to establish safe and repeatable contact with the semiconductor chips. If the wafer probes are rigidly connected to the tuner box (24), then rotational adjustment (28) of the probe tips is only possible by rotating (29) the whole tuner (24). This invention describes an alternative and simpler solution.

In case of a waveguide tuner, which has a test port in form of a waveguide flange (FIG. 7), said rotational adjustability can be provided by elaborated mechanical arrangements (30) of the whole tuner-probe assembly rotating (29) around an axis (FIG. 8). In this case because the center of rotation of the tuner (24) is different than the point of the wafer probe tips (20), then said probe tips will rotate on an arc (28); this means that the adjustment procedure is tedious and complex, since, every time the angle Θ is adjusted the probe tip position changes and it may move out of the scope (31) of the observation (32) microscope (FIG. 7), in which case a new XY positioning of the whole tuner-probe assembly is required, to bring the probe-tips back into focus, test the contact, re-adjust the Θ angle and so on. This can be a frustrating and lengthy experience. In short, a setup involving wafer probes must provide for some rotational adjustment of the wafer probe tips in order to fit perfectly on the chip pads (FIG. 8). Rotational adjustability Θ accepted as adequate at this point of time is ±3.5°.

BRIEF DESCRIPTION OF THE SEVERAL VIEWS OF THE DRAWINGS

The invention and its mode of operation will be more clearly understood from the following detailed description when read with the appended drawings in which:

FIG. 1 depicts prior art, waveguide Load Pull system for biasing and testing transistor chips on wafer.

FIG. 2 depicts prior art, basic configuration of waveguide slide screw impedance tuner principle.

FIG. 3 depicts prior art, tuning range of slide screw impedance tuner.

FIG. 4 depicts prior art, commercially available waveguide wafer probe with DC biasing capacity.

FIG. 5 depicts prior art, wafer probe and impedance tuner assembly, using semi-flexible coaxial RF cable, with Theta angle adjustment.

FIG. 6 depicts prior art, RF wafer probing of chip transistors using flexible cables (no impedance tuner) with Theta angle adjustment.

FIG. 7 depicts prior art, waveguide impedance tuner and wafer probe assembly.

FIG. 8 depicts prior art, Theta angle adjustment through waveguide tuner rotation causing probe movement and an arc.

FIG. 9 depicts waveguide impedance tuner and wafer probe assembly using flexible waveguide for allowing local Theta angle arrangement.

FIG. 10 depicts detailed view of waveguide probe assembly using flexible waveguide allowing Theta angle adjustment.

FIG. 11 depicts commercially available flexible waveguide b) and assemblies a).

FIG. 12 depicts waveguide impedance tuner and wafer probe assembly using a bent section of flexible waveguide between tuner test port and wafer probe.

FIG. 13 depicts waveguide impendence tuner and wafer probe assembly using a flexible waveguide section between probe body and tuner test port.

FIG. 14 depicts waveguide impedance tuner and wafer probe assembly using a straight section of flexible waveguide between the probe and the tuner test port.

FIG. 15 depicts waveguide impedance tuner and wafer probe assembly using a straight section of flexible waveguide between the extended tuner test port and the probe body.

DETAILED DESCRIPTION OF THE INVENTION

A way of adjusting the rotational planarity ("Theta adjustment") is to use a flexible joint between the tuner test port and the wafer probe and limit the Theta adjustment to the probe itself, a technique that has been used in wafer probing at lower frequencies when employing coaxial flexible or semi-rigid cables (FIGS. 5, 6). However this method has never been reported for millimeterwave waveguide impedance tuners.

The proposed alternative is to introduce a flexible link (43 in FIG. 12), (48 in FIG. 9) between the (rigid) waveguide airline of the tuner (33) and either the (rigid) body of the wafer probe itself (36) or the (rigid) waveguide section attached to the body of the wafer probe (47) in FIGS. 9, 12.

The Theta (Θ) adjustment is possible, for instance, by using a rotation pin (35) linking the wafer probe body (36) and the tuner positioner body (37) or the tuner body (38a) and a micrometric screw (38) pushing against a spring (39) to rotate the probe body (40) around the pin (35). The spring (39) ensures that the probe body (40) will turn in the opposite direction if released by the micrometric screw (38).

A flexible waveguide [2] is made in form of a conductive spiral with the nominal dimensions of the rigid waveguide and allows propagation of electro-magnetic waves in the same way as rigid waveguides. In addition it allows a certain amount of rotational or lateral movement without noticeable change in electrical and RF behavior; if done within the specified limits (FIGS. 11a, b). Depending on the frequency range either rectangular [2] or circular [3] flexible waveguide sections can be used.

The flexible section can replace the entire waveguide section of said probe, from the tuner test port to the probe coaxial section, inside the probe body (FIG. 4) or only parts of it. It can be a straight section between the tuner test port and the rigid waveguide section of the probe (41) FIG. 14), or a flexible waveguide section immediately above the probe body (42) (FIG. 15) or a bent flexible section (43) between the tuner test port and the rigid waveguide section connected to the probe body (FIG. 12).

In all cases the plan (44) defined by the three probe tips (45) can be adjusted without rotating the tuner (FIG. 10) and the rotation center of said probe can be set very close to the probe tips (45) with the beneficial effect that, as the probe rotates the probe tips will not escape from the field of vision (31) of the microscope (32) and the tuner will not have to be re-positioned for the probe tips to remain visible. The Theta angle planarity is adjusted before the beginning of the system and tuner calibration, meaning that, even if the RF behavior of the flexible waveguide section (46) changes slightly during bending (47), said change will be part of the calibration and subsequent measured data will be automatically corrected for. The probe planarity does not change during the measurement operation or when the tuner is moved in XY or Z directions (FIG. 9).

The principle of using a flexible waveguide link, allowing effortless and precise adjustment of Theta misalignment of wafer probe tips and semiconductor wafers has been outlined in detail in this invention; other configurations using the same concept shall not impede on the validity or limit the claims to obvious combinations and variations of this basic concept.

What I claim as my invention is:

1. A test system comprising a wafer probe and an electromechanical waveguide impedance tuner (3, 4, 35) and a flexible link between said tuner and wafer probe, said link comprising a section of flexible waveguide, said section of flexible waveguide having an input port and an output port, said tuner having a test port and an idle port and a slotted (16) rigid waveguide transmission line between said ports and at least one metallic probe (15) insertable vertically (18) into the slot of said waveguide transmission line, said flexible waveguide section being inserted in series between the tuner test port and the wafer probe, whereby the planarity (25) of said wafer probe is adjustable.

2. A test system comprising a wafer probe and an electro-mechanical waveguide impedance tuner and a flexible link between said tuner and wafer probe, as in claim 1,
- whereby said section of flexible waveguide is bent and terminates on one end with a flange and on the other end with the body of said wafer probe,
- said flange being connected with the test port of said tuner;
- said wafer probe having the capacity of planarity (25) adjustment using a micrometric screw (38) attached to the body of the tuner (37, 38a).

3. A test system comprising a wafer probe and an electro-mechanical waveguide impedance tuner and a flexible link between said tuner and wafer probe, as in claim 1,
- whereby said section of flexible waveguide terminates on both ends with a flange,
- and whereby said section of flexible waveguide is bent by approximately 90 degrees and is inserted between the flange of the wafer probe and the flange of the tuner test port said wafer probe having the capacity of planarity (25) adjustment.

4. A test system comprising a wafer probe and an electro-mechanical waveguide impedance tuner and a flexible link between said tuner and wafer probe, as in claim 1,
- whereby said flexible link terminates on both ends with a flange,
- and whereby said flexible link is inserted between the flange of the wafer probe and the flange of the tuner test port,
- said wafer probe having the capacity of planarity (25) adjustment.

5. A test system comprising a wafer probe and an electro-mechanical waveguide impedance tuner and a flexible link between said tuner and wafer probe, as in claim 1,
- whereby said flexible link terminates on one end with a flange, which leads to the tuner test port, and
- wherein the other end of said flexible link is attached to the wafer probe body, said wafer probe having the capacity of planarity (25) adjustment.

6. A test system as in claim 1, whereby said tuner is replaced by a signal processing unit (3,4) with at least one waveguide test port, said test port being connected with the wafer probe (34).

* * * * *